United States Patent [19]

Whitfield et al.

[11] Patent Number: 4,912,467

[45] Date of Patent: Mar. 27, 1990

[54] THREE-PART ENCODER CIRCUIT

[75] Inventors: Arthur A. Whitfield, Rochester; Michael L. Wash, Pittsford, both of N.Y.

[73] Assignee: Eastman Kodak Company, Rochester, N.Y.

[21] Appl. No.: 206,408

[22] Filed: Jun. 14, 1988

[51] Int. Cl.⁴ ............................................ H03M 5/08
[52] U.S. Cl. ......................................... 341/53; 360/44; 375/22
[58] Field of Search ................... 341/52, 53, 68, 70, 341/71, 72, 73, 74, 102, 103; 360/44, 51; 375/22, 23

[56] References Cited

U.S. PATENT DOCUMENTS

| | | | |
|---|---|---|---|
| 3,120,927 | 3/1973 | Wolf | 360/44 |
| 4,063,837 | 11/1977 | Rynearson | 360/44 |
| 4,127,878 | 11/1928 | Johnson, Jr. et al. | 360/51 |
| 4,173,026 | 10/1979 | Deming | 360/44 |

Primary Examiner—William M. Shoop, Jr.
Assistant Examiner—H. L. Williams
Attorney, Agent, or Firm—Stephen C. Kaufman

[57] ABSTRACT

Electrical circuits suitable for encoding a binary data stream into a tri-bit code format. The circuits are particularly valuable for situations where the encoding or information transfer rate is dependent on unpredicable and variable transfer rate velocities and accelerations. The circuits provide "self-clocking", which, in turn, permit velocity insensitive encoding.

3 Claims, 4 Drawing Sheets

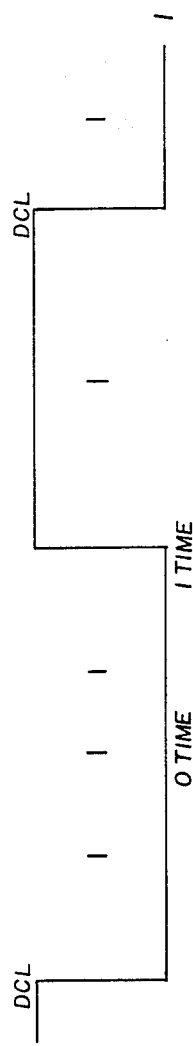
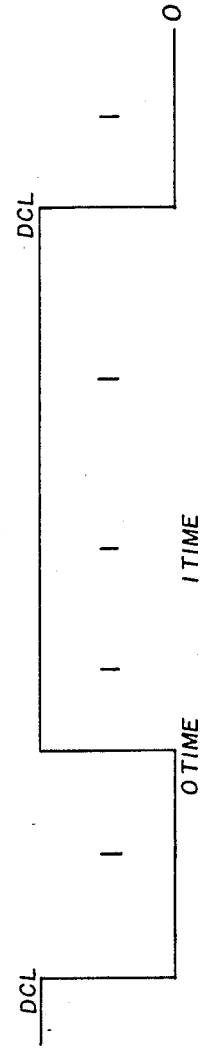
FIG. 4
FIG. 5
FIG. 6
FIG. 7

| CLOCK | 0 TIME | 1 TIME | |
|---|---|---|---|
| 0 | 1 | 1 | DCL LOCATION |
| 1 | 0 | 1 | 0 TIME LOCATION |
| 1 | 1 | 0 | 1 TIME LOCATION |
| 0 | 1 | 1 | DCL LOCATION |
| 1 | 0 | 1 | 0 TIME LOCATION |
| 1 | 1 | 0 | 1 TIME LOCATION |

FIG. 9  TABLE 1

4,912,467

THREE-PART ENCODER CIRCUIT

CROSS-REFERENCE TO A RELATED APPLICATION

This application is related to Application Ser. No. 206,407 filed June 14, 1988, by Wash, and Application Ser. No. 206,646 filed June 14, 1988 by Wash, and Application Ser. No. 253,533 filed June 14, 1988, by Whitfield, which Applications are being filed contemporaneously with this application. The entire disclosures of each of these applications are incorporated by reference herein. Each of these applications is copending and commonly assigned.

FIELD OF THE INVENTION

This invention relates to electrical circuits suitable for encoding a binary data stream into a three-part code format.

INTRODUCTION TO THE INVENTION

A novel method for modulating a binary data stream into a code format suitable for encoding and decoding e.g., magnetic information or optical information, is disclosed in the above-cited Application Ser. No. 206,646 to Wash. The novel method features self-clocking, velocity insensitive encoding and decoding. The Wash disclosure states that preferred electrical circuits that may be employed for realizing the encoding scheme set forth in that disclosure are provided in the present application. This application, therefore, provides novel electrical circuits that may be advantageously employed, for example, for encoding a binary data stream into a three-part code format in accordance with the Wash disclosure. The novel electrical circuits encode the data and preserve the self-clocking, velocity insensitive features of the novel method.

SUMMARY OF THE INVENTION

In one aspect, the invention provides an electrical circuit suitable for encoding a three-part code format from a binary data stream, which circuit comprises:
 (a) a clock means for generating information signals, the information signals
  (1) demarking a bitcell; and
  (2) demarking at least three logic transition locations within the bitcell; and
 (b) a data encoder
  (1) which inputs a binary data stream, and
  (2) in coordination with the clock means information signals, places a logic transition in an assigned location, based on the current element in the binary data stream.

Preferably, the clock means comprises:
 (a) a modulo-n counter, which
  (1) is capable of accepting outside clock transitions, and
  (2) in response to the outside clock transitions, generates repetitive groups of counter signals; and
 (b) an x to y demultiplexer-decoder, which decoder, in response to the counter signals, generates decoder signals which are representative of the information signals.

In one preferred embodiment, the clock means comprises:
 (a) a modulo-3 counter, which
  (1) is capable of accepting outside clock transitions, the outside clock transitions having a frequency 3 times that of an input binary data stream, and
  (2) in response to the outside clock transitions, generates repetitive groups of counter signals, the counter signals comprising 3 groups of binary pairs; and
 (b) a 2 to 3 demultiplexer-decoder, which decoder, in response to the counter signals, generates three decoder signals [D clock 0 time 1 time], for each of three logic transition locations [D clock 0 time 1 time].

For this preferred embodiment, the serial data encoder preferably comprises:
 (a) a logical AND circuit for determining if an input binary datum logic transition is to be assigned a 0 time location; and
 (b) a logical OR circuit for determining if an input binary datum logic transition is to be assigned a 1 time location.

In another aspect, the invention provides an electrical circuit suitable for encoding a three-part code format from a binary data stream, which circuit comprises:
 (a) means for defining a bitcell as the time t between two adjacent clock transitions, and writing a first clock transition at the beginning of the bitcell; and
 (b) means for encoding a binary data transition after the first clock transition in the ratio of $t_d/t$, where $t_d$ is the time duration between the first clock transition and the data transition, with the proviso that the ratio distinguishes a data 0 bit from a data 1 bit.

Preferably, the ratio $t_d/t < \frac{1}{2}$ encodes a data 0 bit, and the ratio $t_d/t > \frac{1}{2}$ encodes a data 1 bit.

Preferably, the clock transitions are the opposite polarity of the data transition.

BRIEF DESCRIPITON OF THE DRAWINGS

The invention is illustrated in the accompanying drawing, in which

FIG. 1 shows, in a generalized fashion, a three-part code format, and

FIG. 2 and 3 show the encoding of data bits 1 and 0 respectively in accordance with this format;

FIG. 4 shows in a generalized fashion, a second three-part code format that helps explain the present invention, and FIGS. 5 and 6 show the encoding of data bits 1 and 0 respectively in accordance with the FIG. 4 three-part code format;

FIG. 7 shows another three-part code format that is employed by electrical circuits of the present invention;

Figure 8:
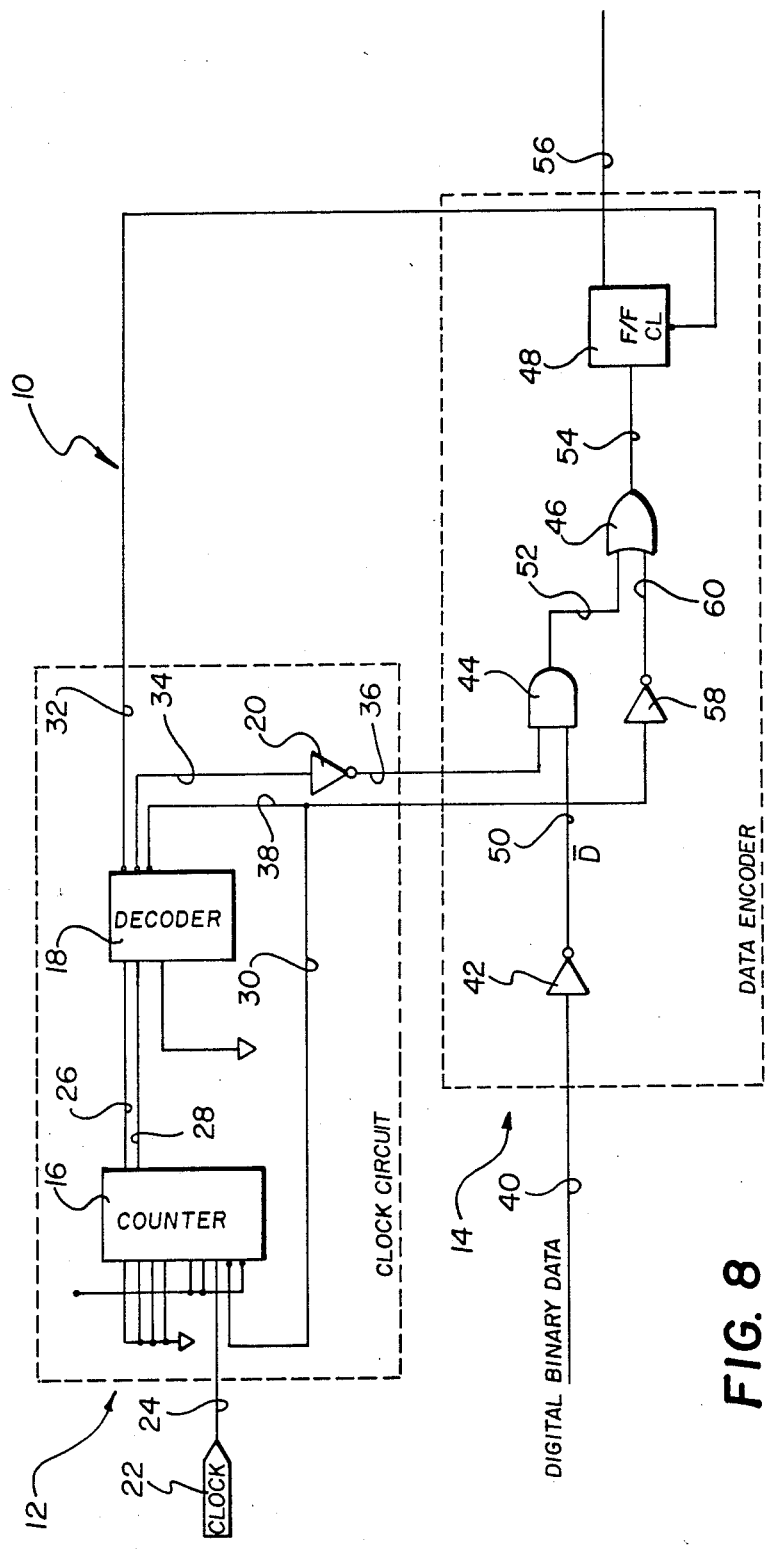
FIG. 8 shows a preferred electrical circuit of the present invention.
Figure 10:
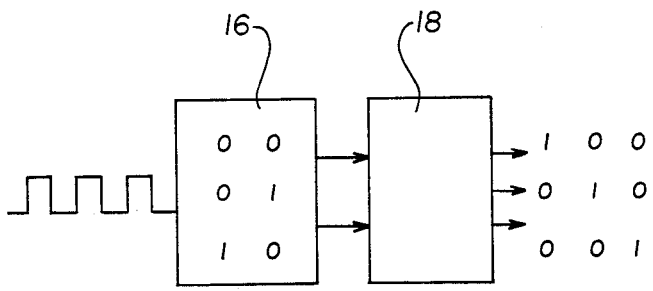

FIG. 9 provides a Table I logic matrix generated by the FIG. 8 electrical circuit; and FIG. 10 provides a generalized schematic on the operation of the FIG. 8 clock means.

DETAILED DESCRIPTION OF THE INVENTION

Important aspects of the Wash Ser. No. disclosure are first reviewed from a perspective that will facilitate a clear understanding of the electrical circuits of the present invention. To this end, attention is now directed to FIG. 1, which reproduces the Wash Ser. No. 206,407 FIG. 1 three-part code format comprising a [Clock (CL) 0 1] sequence. The sequence denotes time locations for logic transitions. As employed in this specification, a term "transition pulse" usually refers to only one edge i.e., either leading (low-to-high) or trailing (high-to-low) of a pulse.

Figure 1:
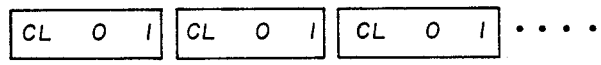

The FIG. 1 three-part code format, in accordance with one aspect of the Wash disclosure, operates on an input binary data stream by the method steps of:

(1) defining a bitcell as the time t between two adjacent clock transitions;
(2) writing a first clock transition at the beginning of the bitcell; and
(3) encoding a binary data transition after the first clock transition, in the ratio of $t_d/t \cong \frac{1}{3}$ to encode a 0 bit, and in the ratio of $t_d/t \cong \frac{2}{3}$ to encode a 1 bit, where $t_d$ is the time duration from the first clock transition to the data transition.

Figure 2:
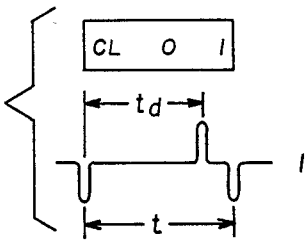
Figure 3:
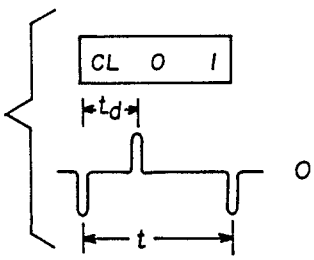

In accordance with these steps, a data 1 bit is encoded as indicated by FIG. 2, and a data 0 bit is encoded as indicated by FIG. 3.

I have discovered that, for purposes of realizing the encoding schemes of FIGS. 2 and 3 in electrical circuits, it is advantageous to reformat the contents of FIG. 1, 2 and 3 in the manner shown in FIGS. 4, 5 and 6. In particular, FIG. 4 shows a three-part code format comprising a [DCL 0 time 1 time]* sequence. For this sequence, the time $t_d$ coincides with the location 0 time or 1 time, depending upon whether a data 0 bit or a data 1 bit is being encoded, respectively. This sequence is further explained by reference to FIG. 5. FIG. 5 shows an encoded data 1 bit. The encoding proceeds in accordance with the method steps set forth above. Thus, a clock transition is written at the beginning or DCL location of the bitcell. Here, the logic level goes from high to low. The logic level stays low through the location 0 time, and jumps at the data transition to a logic high at the location 1 time. The logic level stays high until the adjacent clock transition at the time t, as measured from the previous clock transition. A data 1 bit has thus been encoded, since $t_d/t = \frac{2}{3}$. Note that the waveform of FIG. 5 is substantially the same as the waveform for FIG. 2, since both encode a data 1 bit by way of the same method steps.

*DCL is an abbreviation of "Data Clock".

To complete the explanation of the FIG. 4 format, consider the encoding of a data 0 bit (FIG. 6) The encoding proceeds in accordance with the method steps set forth above. Hence, FIG. 6 shows a clock transition that is written at the beginning or DCL location of the bitcell, where the logic level goes from high to low. The logic level stays low until the location 0 time, at which point the logic level jumps with the data transition at time $t_d$ to a logic high. The logic level stays high until the adjacent clock transition. A data 0 bit has thus been encoded, since $t_d/t = \frac{1}{3}$. Note that the waveform of FIG. 6 is substantially the same as the waveform for FIG. 3, since both encode a data 0 bit by way of the same method steps. In summary, an intermediate low-to-high data transition occurs between two adjacent and successive clock transitions (high-to-low), near one of two predetermined locations, 0 time or 1 time, depending on whether the current data bit to be encoded is a data 0 bit or data 1 bit, respectively.

I have further discovered that for both the data 1 bit and the data 0 bit, the logic level is high for each data bit, 0 or 1, from the location "1 time" to the adjacent clock transition. This identity of a common high logic level is clear from inspection of FIGS. 5 and 6. This discovery, that the data 1 bit is only high at "1 time", and that the data 0 bit is high at 0 time and stays high until the adjacent D clock time, in turn suggests another three-part code format, shown in FIG. 7. FIG. 7 shows a [DCL $\overline{D}$ 1] sequence. The FIG. 7 format may first be distinguished from the FIG. 4 format, in that the "1 time" location of FIG. 4 has now been formalized as an invariant logic high, capitalizing on the last discovery that the logic level is high for this location for each data bit, 1 or 0. Secondly, the FIG. 7 format replaces the FIG. 4 "0 time" enumeration, by a corresponding $\overline{D}$enumeration. Here, $\overline{D}$ signifies the logic transformation, "NOT Data". For example, a data 1 bit becomes, under the $\overline{D}$ transformation, a logic low at "0 time"; a data 0 bit becomes, under the $\overline{D}$ transformation, a logic high at "0 time". It should be clear, although not shown, that the encoding of a data 1 bit and a data 0 bit, by way of the three-part code format of FIG. 7, leads to the identical waveforms of FIGS. 5 and 6, for the data 1 bit and data 0 bit, respectively. The desirability and utility of the three-part code format of FIG. 7 will become clearer from the following analysis of a preferred electrical circuit of the present invention.

Attention, accordingly, is now directed to FIG. 8, which shows an electrical circuit 10 suitable for encoding a three-part code format from a binary data stream. The circuit 10 comprises a three-phase clock circuit 12, and a data encoder 14. In particular, the clock circuit 12 comprises a modulo-3 counter 16, a 2-3 demultiplexer-decoder 18, and an inverter 20. The clock circuit 12 is structurally completed by observing that the modulo-3 counter 16 accepts outside clock pulses from an outside clock 22, along a line 24. The modulo-3 counter 16 provides outputs along lines 26, 28 to the decoder 18, and receives an input along a line 30 which is an output from the decoder 18. The decoder 18 provides a set of three output information signals, namely [D clock 0 time 1 time] for input, along three lines 32, 34, 38 respectively, to the data encoder 14.

Turning now to the data encoder 14 in detail, it is observed that it is structurally completed as follows. The data encoder 14 accepts binary data from an outside line 40. The binary data is routed through an inverter 42, an AND gate 44, an OR gate 46 and a flip-flop 48. The connecting lines 50, 52, 54 and 56 provide the appropriate routing paths. The data encoder 14 also includes an inverter 58 which accepts from the clock circuit 12 the 1 time information from line 38, and inputs an inverted 1 time information signal along a line 60 to the OR gate 46.

The operation of the FIG. 8 electrical circuit 10 is now described. In summary, the clock circuit 12 generates three one-bit information signals, which signals demarcate the bitcell and demarcate three transition locations within a given bitcell i.e., [DCL 0 time 1 time] per FIGS. 4, 5 or 6 above; the data encoder 14, in coordination with the clock information signals, places the transitions in the proper locations based on the binary data from line 40.

The operation of the circuit 10 begins with the start of a new bitcell. This is effected by the clock circuit 12 generating the three information signals in accordance with Table I shown in FIG. 9. *How* the clock circuit 12 generates these information signals is disclosed below. Proceeding, therefore, the first row of Table I shows that at the beginning of the new bitcell, the DCL location,

| | | |
|---|---|---|
| DCL | = | logic 0 (low) |
| 0 time | = | logic 1 (high) |

-continued

| 1 time | = | logic 1 (high) |

The clock 12 therefore outputs a logic low on line 32, a logic high on line 34, and a logic high on line 38.

Assume, now, that a data 1 bit is provided along the line 40 for input to the data encoder 14. The data 1 bit is first encoded at the location DCL. To do this, the data 1 bit is inverted by the inverter 42, and becomes a data 0 bit i.e., $\overline{D}$. The data 0 bit, or $\overline{D}$, in turn, becomes the first of the two inputs to the AND gate 44. The second input to the AND gate 44 is the inverted 0 time logic level on line 36, namely, a logic low. The AND gate 44 therefore outputs a logic low, given its two logic low inputs. Continuing, the AND gate 44 logic low output becomes the first of two inputs to the OR gate 46. The OR gate 46 second input is the inverted 1 time logic level on line 60, namely, a logic low. The OR gate 46, accordingly, outputs a logic low, given its two logic low inputs. This OR'd logic low output may be stored by the flip-flop 48, and represents the encoded portion of the data 1 bit for the DCL location. This result is in agreement with FIG. 5 above.

The next location of encoding the data 1 bit occurs at the 0 time location. Table I, row two, shows that the required clock circuit 12 information signals contemporaneous with the 0 time location are:

| DCL | = | logic 1 (high) |
| 0 time | = | logic 0 (low) |
| 1 time | = | logic 1 (high) |

The clock circuit 12, therefore, now outputs a logic high on line 32, a logic low on line 34, and a logic high on line 38. The data 1 bit has not changed, however, so that the line 50 input to the AND gate 44, $\overline{D}$, is still a logic low. The second AND gate 44 input is the inverted 0 time logic, namely, a logic high. The logical AND operation determines if a data bit transition is to occur at the 0 time location. We know from FIG. 5 above, that at the 0 time location, a data bit 1 should have a logic low. This is in fact what the AND operation provides. The AND gate 44 outputs a logic low, given its low and high logic inputs. Continuing, the AND gate 44 logic low output becomes the first of two inputs to the OR gate 46. The second OR gate 46 input is the inverted 1 time logic on line 60, namely, a logic low. The OR gate 46, accordingly, outputs a logic low, given its two logic low inputs. This OR'd logic low output may be stored by the flip-flop 48, and represents the encoded portion of the data bit 1 for the 0 time location. This result is in agreement with FIG. 5 above.

The next and final location of encoding the data 1 bit occurs at the 1 time location. Table I, row three, shows that the required clock circuit 12 information signals contemporaneous with the 1 time location are:

| DCL | = | logic 1 (high) |
| 0 time | = | logic 1 (high) |
| 1 time | = | logic 0 (low) |

The clock circuit 12, therefore, now outputs a logic high on line 32, a logic high on line 34, and a logic low on line 38. The data 1 bit has not changed, however, so that the line 50 input to the AND gate 44, $\overline{D}$, is still a logic low. The AND gate 44 second input is the inverted 0 time logic, namely, a logic low. The AND gate 44 therefore outputs a logic low, given its two logic low inputs. Continuing, the AND gate 44 logic low output becomes the first of two inputs to the OR gate 46. The OR gate 46 second input is the inverted 1 time logic on line 60, namely, a logic high. The logical OR gate 46 operation determines if a data bit transition is to occur at the 1 time location. We know from FIG. 5 above, that at the 1 time location, a data bit 1 should have a logic high. This is in fact what the OR gate 46 provides. The OR gate 46, accordingly, outputs a logic high, given its low and high logic inputs. This OR'd logic high output may be stored by the flip-flop 48, and represents the encoded portion of the data 1 bit for the 1 time location. This result is in agreement with FIG. 5 above. In summary, the data bit 1 has now been encoded by the circuit 10 so that it has a complete encoded waveform identical to FIG. 5 above.

The operation of the circuit 10 for encoding a data 0 bit, as compared to the disclosure for the data 1 bit, proceeds mutatis mutandis. For example, the clock circuit generates information signals in accordance with Table I. One important difference, however, is that $\overline{D}=1$ throughout the encoding locations. This difference results in a data 0 bit encoding that is in agreement with FIG. 6 above.

The discussion reserved from above, on how the clock circuit 12 generates the information signals summarized in Table I, is now set forth. Recall that the clock circuit 12 comprises the modulo-3 counter 16, which accepts clocks pulses from the outside clock 22, and the 2-3 demultiplexer-decoder 18. In a preferred embodiment, shown symbolically in FIG. 10, the modulo-3 counter 16 receives an outside clock pulse, running at 3 times the frequency of the input data stream, and generates sequentially three binary pairs viz., 00.
01
10

This sequence of binary pairs, provided in turn as inputs via the line pair 26, 28 to the decoder 18, result in a sequence of binary triplets viz., 100.
010
001

The decoder 18 output in the FIG. 8 electrical circuit is actually the complement of this sequence viz., 011.
101
110

Note that this second matrix corresponds to Table I, and represents the information signals. In other embodiments, not shown, a decoder that provides the first sequence may be utilized, thus dispensing with the inverters 20 and 58, and necessitating an inverter (not shown) interrupting line 32. The clock circuit 12 operation is completed with the fact that the decoder 18, by way of the 1 time signal on line 30, resets the modulo-3 counter 16, at the end of a bitcell, in anticipation of the start of a new bitcell.

The operation of the FIG. 8 electrical circuit 10 is conditioned on the following criteria:

(1) the clock transitions are the opposite polarity of the data transition. In particular, the clock transitions are negative; the data transition is positive. In other circuit embodiments, not shown, these polarities may be reversed, while still uniquely differentiating the clock transitions from the data transition. This feature provides "self-clocking", which, in turn, permits velocity insensitive encoding and decoding.

(2) the information signals demark three transition locations, spaced equidistant. In other circuit embodiments, not shown, the transition locations may be spaced at any location determined by the method ratio $t_d/t$, with the proviso that the transition location do not result in an indeterminacy in differentiating a data 0 bit from a data 1 bit. The indicated changes trade off data bit discrimination against encoding efficiency.

(3) the data encoder 14 places a data 1 bit logic transition at the 1 time location, and a data 0 bit logic transition at the 0 time location. In other circuit embodiments, not shown, these locations may be routinely reversed so that e.g., the data 1 bit logic transition is placed at the 0 time location, and the data 0 bit logic transition is placed at the 1 time location.

(4) the modulo-3 counter 16 receives an outside clock pulse stream running at 3 times the frequency of the input data stream. In other circuit embodiments, not shown, the counter 16 can receive outside clock pulses running integer multiples of the frequency of the input data stream.

(5) the circuit 10 makes use of AND gates, OR gates, inverters, clock circuit components etc. Conventional such components can be used for this purpose.

(6) although the present invention employs the AND gate circuit 44 and OR gate circuit 46 for determining if a data bit transition is to occur at a specified location, it is possible to provide alternative, equivalent logic. For example, the AND gate circuit 44 and/or the OR gate circuit 46 may be replaced by suitable NAND-gate modules. Those skilled in the art will have no difficulty, having regard to the disclosure herein and their own knowledge, in making and using the invention and in obtaining the advantages of the various embodiments.

The three-part code format can also be encoded by a software program running in a microprocessor, thus eliminating the need for discrete hardware. One drawback to this, however, is speed, since most microprocessors, without the addition of memory/buffer circuits and output hardware, will not be able to send out the three-part encoded data as fast as, for example, the FIG. 8 circuit 10. A suitable software encoding routine written in BASIC language is now listed:

```
10  REM ** THREE-PART ENCODING ROUTINE **
20  DIM THREE-PART (DATAQTY*3)         ENCODED ARRAY FOR DATA
30  I=0                                SET ARRAY POINTER TO 0
40  FOR I=1 TO DATAQTY                 LOOP THROUGH DATA
50     THREE-PART (I)=0                CLOCK TRANSITION
60     THREE-PART (I+1)= NOT DATA(J)   DATA 0 TRANSITION
70     THREE-PART (I+2)= 1             DATA 1 TRANSITION
80     I=I+3
90  NEXT J                             INCREMENT THREE-PART POINTER
```

What is claimed is:

1. An electrical circuit suitable for encoding a tri-bit code format from a binary data stream, which circuit comprises:
  (a) a clock means for generating information signals, the information signals demarking at least three logic transition locations within a bitcell; and comprising
    (a) a modulo-n counter, which
      (1) is capable of accepting an outside clock pulse stream, and
      (2) in response to the outside clock pulses, generating repetitive groups of counter signals; and
    (b) an x to y demultiplexer-decoder, which decoder, in response to the counter signals, generates decoder signals which are representative of the information signals; and
  (b) a data encoder
    (1) which inputs a binary data stream, and
    (2) in coordination with the clock means information signals, places a logic transition in an assigned location, based on the current element in the binary data stream.

2. A circuit according to claim 1, wherein the clock means comprises:
  (a) a modulo-3 counter which
    (1) is capable of accepting an outside clock pulse stream, having a frequency 3 times that of an input serial binary data stream, and
    (2) in response to the outside clock pulse stream, generates repetitive groups of counter signals, the counter signals comprising a group of three binary pairs; and
  (b) a 2 to 3 demultiplexer-decoder, which decoder, in response to the counter signals, generates three decoder signals [D clock 0 time 1 time], for each of three logic transition locations [D clock 0 time 1 time].

3. A circuit according to claim 2, wherein the data encoder comprises:
  (a) a logical AND circuit for determining if an input binary datum logic transition is to be assigned a 0 time location; and
  (b) a logical OR circuit for determining if an input binary datum logic transition is to be assigned a 1 time location.

* * * * *

UNITED STATES PATENT AND TRADEMARK OFFICE
CERTIFICATE OF CORRECTION

PATENT NO. : 4,912,467
DATED : March 27, 1990
INVENTOR(S) : Whitfield et al

It is certified that error appears in the above-identified patent and that said Letters Patent is hereby corrected as shown below:

| | |
|---|---|
| Column 2, line 61 | After No. add --206,407-- |
| Column 4, line 1 | "D" should read --$\bar{D}$-- |
| Column 4, line 8 | "Denumeration" should read --$\bar{D}$ enumeration-- and "Dsignifies" should read --$\bar{D}$ signifies-- |
| Column 4, line 10 | "Dtransformation" should read --$\bar{D}$ transformation-- |
| Column 4, line 11 | "Dtransformation" should read --$\bar{D}$ transformation-- |
| Column 7 in the Table | 40 "I=0" should read --J=1-- |

Signed and Sealed this

Fourth Day of June, 1991

Attest:

HARRY F. MANBECK, JR.

*Attesting Officer*     *Commissioner of Patents and Trademarks*